United States Patent [19]

Grüning

[11] Patent Number: 5,237,225
[45] Date of Patent: Aug. 17, 1993

[54] SWITCHING ARRANGEMENT FOR AN RF GTO

[75] Inventor: Horst Grüning, Wettingen, Switzerland

[73] Assignee: Asea Brown Boveri Ltd., Baden, Switzerland

[21] Appl. No.: 800,239

[22] Filed: Nov. 29, 1991

[30] Foreign Application Priority Data

Dec. 8, 1990 [EP] European Pat. Off. ........ 90123659.6

[51] Int. Cl.$^5$ ............................................. H03K 17/72
[52] U.S. Cl. ...................... 307/633; 307/263; 363/135
[58] Field of Search ............... 307/633, 305, 268, 263; 363/68, 70, 71, 96, 137, 135

[56] References Cited

U.S. PATENT DOCUMENTS

| | | | |
|---|---|---|---|
| 4,370,607 | 1/1983 | Dossonville | 363/68 |
| 4,456,836 | 6/1984 | Matsuda et al. | 307/633 |
| 4,612,561 | 9/1986 | Kimura et al. | 363/70 |
| 4,675,543 | 6/1987 | Mitsuoka | 307/633 |
| 4,733,146 | 3/1988 | Hamby | 363/137 |
| 4,805,081 | 2/1989 | Chambers et al. | 363/71 |
| 4,924,370 | 5/1990 | Toelle | 363/96 |
| 4,951,187 | 8/1990 | Stemmler | 363/71 |
| 4,965,709 | 10/1990 | Ngo | 363/137 |
| 5,031,088 | 7/1991 | Tanaka | 363/96 |
| 5,051,603 | 9/1991 | Walker | 363/137 |

FOREIGN PATENT DOCUMENTS

| | | |
|---|---|---|
| 0228226 | 7/1987 | European Pat. Off. . |
| 0320784 | 6/1989 | European Pat. Off. . |
| 0381849 | 8/1990 | European Pat. Off. . |
| 2580127 | 10/1986 | France . |
| 0039561 | 3/1979 | Japan .................. 307/633 |
| 0068735 | 5/1980 | Japan .................. 307/633 |
| 0052231 | 3/1982 | Japan .................. 307/633 |
| 0091018 | 4/1987 | Japan .................. 307/633 |

OTHER PUBLICATIONS

Industry Applications Society, IEEE-IAS-1985 Annual Meeting, 1985, 6 pages, A. P. Connolly, et al., "Application of GTO Thyristor Modules".

"Two New GTO Modules for Drive Applications", by D. Eisele, et al., pp. 519-525, 73, No. 9, Sep. 1986.

*Primary Examiner*—John Zazworsky
*Attorney, Agent, or Firm*—Oblon, Spivak, McClelland, Maier & Neustadt

[57] ABSTRACT

A switching arrangement for an RF-GTO is specified. It comprises a latching-type semiconductor component (GTO) of familiar construction. The circuit for turning off the semiconductor component (GTO) is designed in such a manner that the turn-off gain $I_A/I_G$, peak is distinctly less than 3 and, in particular, less than or equal to 1. During the turning-off, the drive is hard, that is to say has a high rate of increase $dI_G/dt$ and high current. A capacitance ($C_p$) is connected directly in parallel with the semiconductor component (GTO).

16 Claims, 4 Drawing Sheets

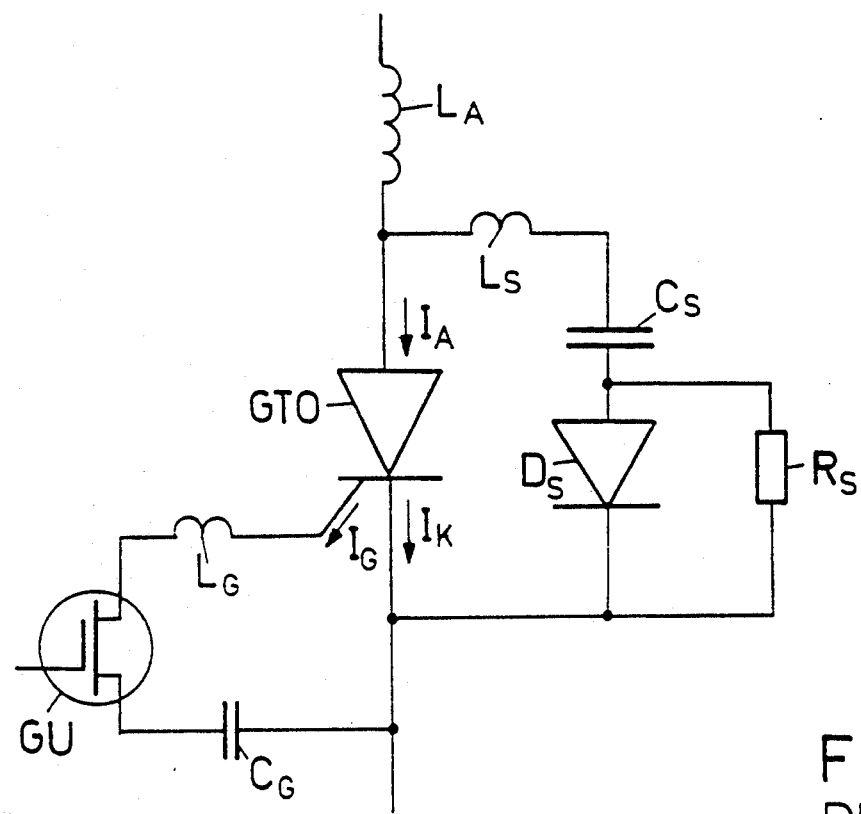
FIG.1
PRIOR ART
FIG.3
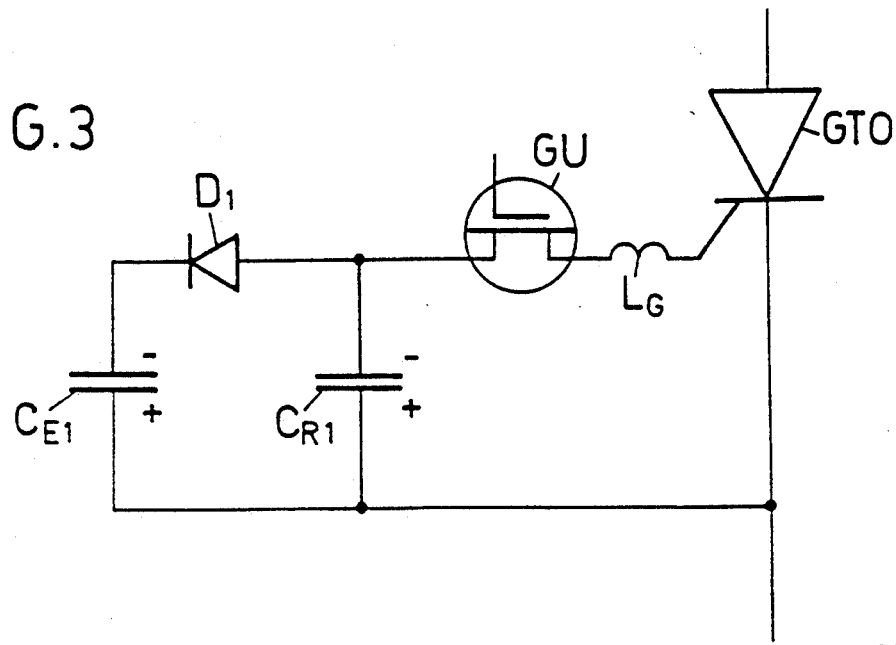

SWITCHING ARRANGEMENT FOR AN RF GTO

BACKGROUND OF THE INVENTION

1. Field of the Invention

The invention relates to a switching arrangement for a high-power RF GTO comprising a latching-type semiconductor component having an anode, a cathode and a gate and means for generating a gate current $I_G$ at the gate for turning off the semiconductor component.

2. Discussion of Background

Today, about 190 GTO types from well over 10 semiconductor manufacturers are available on the market. Their application is mainly divided into three important fields, namely traction (for example locomotives), UPS (uninterruptible power system) and industrial drive systems. This wide distribution has occurred in spite of the fact that the GTO has some problems for the user, for example with respect to circuit engineering. An improvement of the GTO with respect to its protective circuit therefore has enormous economic significance.

The user is confronted, in particular, by the following problems in connection with the GTO:
complexity in the drive system;
turn-off failures;
maintenance of the spike voltage;
switching losses in the GTO and in the protective circuit;
cooling.

Gate turn-off thyristors (GTOs) have hitherto had to be operated with protective networks (snubbers) of considerable complexity. Apart from the additional weight, increased volume and considerable losses, this also entails, in particular, additional development and production costs. The development of control software is also much more expensive due to the complicated mode of operation determined by the snubbers. The aim is therefore to reduce the size of the snubbers (smaller inductances and smaller capacitances) and to simplify them. An important role is played by, in particular, the stray inductance and the snubber diode. A considerable design effort must be made to reduce overvoltages. Recently, quite special diodes have also been developed for these applications.

It has been recognized that the reason for requiring snubbers lies in the non-homogeneous turning-on and off characteristics of the GTOs: this fact has been emphasized time and again in long studies involving infrared, thermal and induction measurements. Efforts have therefore been directed towards the production of the most homogeneous components possible (particularly with respect to doping). In spite of significant improvements in the doping homogeneity, however, it has not been possible to simplify or reduce the size of the snubbers to any significant extent.

The desired aim of users and manufacturers is the RF GTO. This should be distinguished by, among other things, a greatly reduced protective circuit complexity, by low drive power and few turn-off failures. Until now, however, it has not been known how such a component should look and how it should be operated. Ignorance of the true causes of the turn-off failures in the GTO is a great impediment.

SUMMARY OF THE INVENTION

It is the object of the invention to specify a switching arrangement of the type initially mentioned which eliminates the problems existing in the prior art. In particular, it should be possible to achieve the RF GTO aimed for by means of the known GTO packages.

The invention specifies various approaches to a solution for the object set. They achieve the aim both individually and in connection with one another. All of them are based on the recognition of the true causes of the failure of the GTOs during turn-off.

According to the invention, at least one of the following principles should be implemented as a circuit for achieving the RF GTO:

The gate drive for turning off the GTO component is designed in such a manner that it achieves a turn-off gain $I_A/I_{G,peak}$ which is distinctly less than 3 and, in particular, less than or equal to 2 and that an anode voltage rise $dV_A/dt$ of at least 1 kV/$\mu$s is obtained.

During the entire turn-off process, the gate current $I_G$ is of such a magnitude that an anode voltage rise of at least 1 kV/$\mu$s is obtained and that the cathode current $I_K$ is always less than or equal to zero, taking into consideration Kirchhoff's law $I_G + I_K = I_A$, $I_A$ designating the anode current.

During the turn-off, the gate current $I_G$ is at least twice as large as the tail current $I_{tail}$ occurring.

The gate current $I_G$ has a rate of increase $dI_G/dt$ which is sufficient for building up a gate current of the magnitude of the maximum disconnectable anode current $I_{A,max}$ within 1 $\mu$s.

Individual ones or several of the four conditions can be advantageously satisfied with the circuit technology described in the text which follows.

According to an advantageous embodiment of the invention, the gate unit is connected with as low an inductance as possible to the gate of the GTO component so that a gate circuit inductance of preferably less than 50 nH exists. In particular, a ribbon conductor as described, for example, in the published Patent Application EP-0,381,849 A1 is suitable as low-inductance connection. Furthermore, means (for example at least one capacitance $C_{R1}$ or a pulse shaping network) should be provided which generate a rapidly rising gate current which is maintained at least until the tail current decays. In any case, the gate current should be greater than the tail current.

The said means preferably comprise a capacitance $C_{R1}$ which has a voltage of at least 100 V before the GTO component is turned off. In this manner, the desired gate current can be built up with sufficient speed in spite of the existing gate circuit inductance. In addition, it is recommended to provide at least one further capacitance $C_{E1}$ which, after the discharge of the capacitance $C_{R1}$, pulls a holding current from the gate which endures for a relatively long time.

To satisfy the conditions described with little expenditure, a capacitance $C_p$ can be preferably provided directly in parallel with the GTO component between anode and cathode, which capacitance limits the anode voltage rise $dV_A/dt$ at high voltages and takes over some of the energy from an inductance $L_A$ (choke di/dt) connected to the anode. At least after an anode voltage $V_A = 400$ V has been reached, the rise should be limited in such a manner that the subsequent anode current becomes less than the gate current.

So that the GTO component is not loaded too much during turn-on, on the one hand, by the parallel capacitance $C_p$ and, on the other hand, is still sufficiently supported during turn-off, it should be dimensioned in accordance with the following rule with respect to the anode current $I_A$:

$$3 kV/\mu s \leq I_A/C_p \leq 10\ kV/\mu s.$$

In general, a conventional snubber (with a capacitance $C_s$) will still be needed in addition to this parallel capacitance $C_p$ in order to keep the overvoltages caused by $L_A$ within the usual limits.

Means for keeping the energy stored in the inductance $L_A$ away from the parallel capacitance $C_p$ can be preferably provided which act in the manner of a freewheeling circuit and, as a result, allow particularly low overvoltages and, at the same time, energy return.

The risk of overloading the GTO due to the parallel capacitance $C_p$ can be kept low by means of a hard turn-on. The protective circuits for turning-on and -off are preferably designed as analogous circuits. The rate of increase $dI_G/dt$ should be greater than 200 A/$\mu$s.

To achieve a clean turn-off, means for limiting the rate of anode voltage increase $dV_A/dt$ during the turn-off process must be preferably provided.

The invention is primarily intended for circuits in which the means for generating the gate current (gate unit) are arranged outside the package of the semiconductor component. This applies to most of the conventional components of the preferred power category from 1.5 kV and from 1 kA. The term "latching-type semiconductor component" includes 2-layer components of the type of an FCTh or of an SITh and 4-layer components of the type of a GTO or of an FS GTO.

Further advantageous embodiments are found in the totality of the dependent patent claims.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 shows a circuit diagram of a protective GTO circuit according to the prior art;

FIG. 3 shows a protective gate circuit for turning off the GTO;

The reference symbols used in the drawings and their meaning are listed in summary in the list of designations. In principle, like reference symbols designate identical or corresponding parts throughout the several figures.

DESCRIPTION OF THE PREFERRED EMBODIMENTS

To provide a better appreciation of the invention in its entirety, the problems and faults in the known snubber circuit will first be discussed. This is because, once the causes of the turn-off failure have been recognized in all detail, there are no longer any insurmountable difficulties in translating the conclusions into circuits.

FIG. 1 shows a circuit diagram of a conventional protective GTO circuit. In the center there is the GTO component. Its anode is connected to a choke $L_A$ for limiting $dI/dt$. The snubber comprises an inductance $L_s$, a capacitance $C_s$, a resistor $R_s$ and a diode $D_s$. To turn off the GTO component, a gate unit GU is provided which discharges a capacitance $C_G$ into the gate. During this process, the gate current is delayed by an inductance $L_G$.

Figure 2:
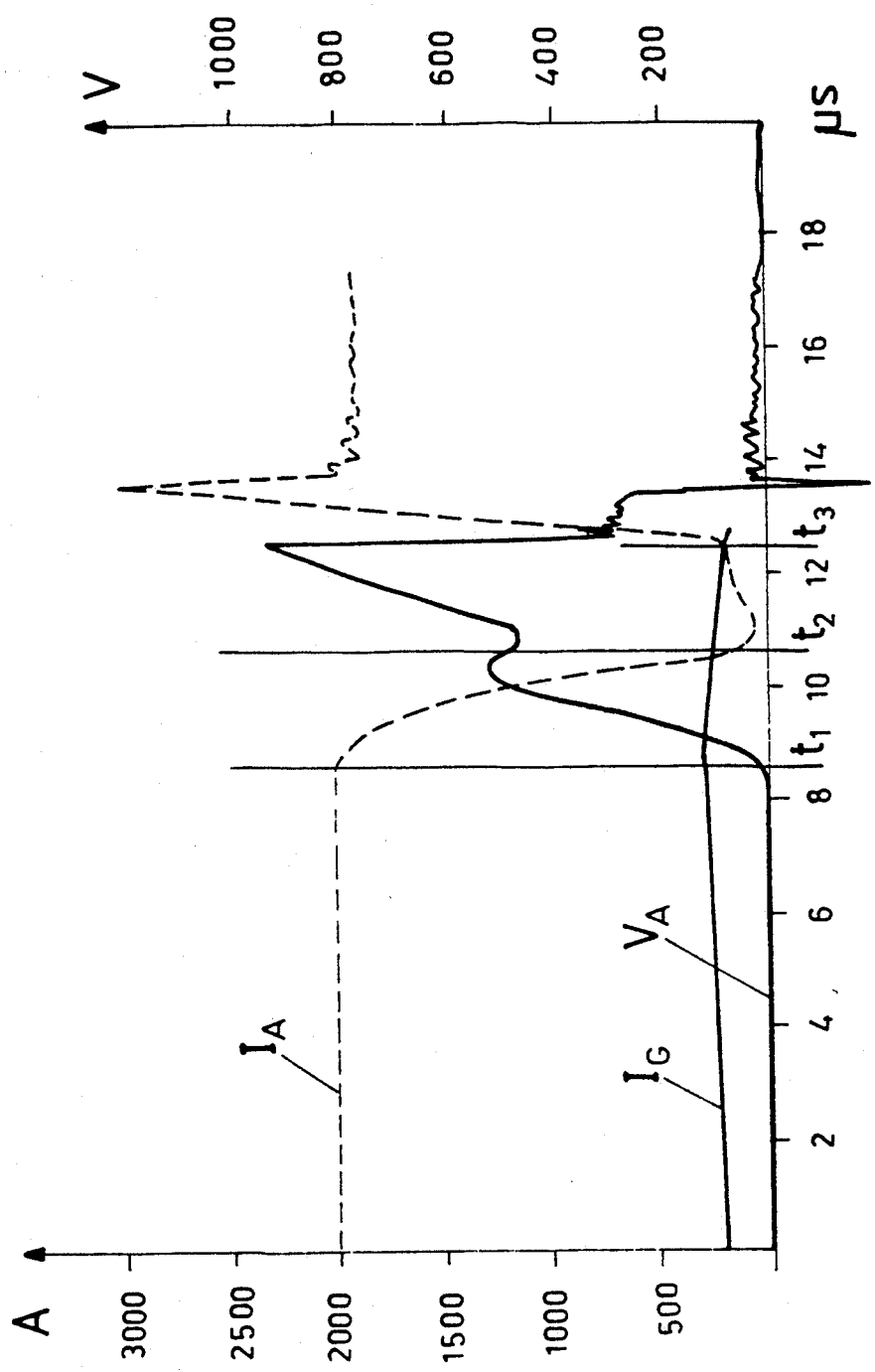
FIG. 2 shows a graphical representation of anode voltage $V_A$, anode current $I_A$ and gate current $I_G$ during turn-off under too high a load in accordance with the prior art.

FIG. 2 shows anode voltage $V_A$, anode current $I_A$ and gate current $I_G$ during faulty turn-off in a known protective GTO circuit (FIG. 1). The cathode current $I_K$, not drawn, can be determined by applying Kirchhoff's law ($I_G + I_K = I_A$). The time is plotted in $\mu$s along the abscissa (the zero point of the time has no significance in this context). On the left-hand side, the current is plotted in amperes and on the right-hand side of the diagram the voltage is plotted in volts.

To turn off the GTO, a gate current $I_G$ is impressed on the gate with a rate of increase $dI_G/dt$ of typically 10 A/$\mu$s. However, the anode current continues to flow essentially unchanged over a relatively long time of 6 to 15 $\mu$s (depending on the magnitude of the anode current). At a particular time $t_1$, the gate current $I_G$ reaches the threshold defined by the turn-off gain, which causes the GTO to turn off. To keep the gate current, and thus the drive power, as low as possible, highest-possible turn-off gains $I_A/I_{G,peak}$ are aimed for today, $I_{G,peak}$ designating the maximum gate current. These ratios are typically within a range of between 3 and 5.

Once the threshold defined by the turn-off gain has been reached, the anode voltage $V_A$ begins to rise. At the same time, the anode current $I_A$ drops. Due to Kirchhoff's law, however, the cathode current $I_K$ must be greater than zero until the anode current $I_A$ has dropped to the level of the gate current $I_G$ (time $t_2$ in FIG. 2). In this time interval (that is to say from $t_1$ to $t_2$), the component is in an unstable and thus hazardous state: the GTO, which is designed as a switch and not as a regulator (remember the known equivalent circuit diagram of two coupled transistors) is forced to respond with current inhomogeneities to this stress.

In other words: because, with a slow rise in gate current (which is controlled by the capacitance $L_G$), the component is "good natured" enough to turn off with a correspondingly low gate current (corresponding to the high turn-off gain always demanded), it cannot allow the cathode current to decrease to zero (due to Kirchhoff's law) when it has to absorb voltage, but has to enter the region of instability which puts it itself at risk.

In most cases, however, the GTO endures this first hazardous zone, and not least, however, due to the fact that the spike voltage (that is to say the voltage peak of approximately 500 V shortly before $t_2$, which is caused by the snubber) is kept down with all means. This is because it has been recognized that the spike voltage is a critical parameter.

After $t_2$, the anode current $I_A$ is less than the gate current $I_G$ and, as a result, the cathode current $I_K$ is negative. The GTO is in a stable state again. Meanwhile, the anode voltage $V_A$ continues to rise. The anode current $I_A$ passes through a minimum before the tail current starts. As soon as the tail current intersects the gate current $I_G$, however, (time $t_3$), the component enters the second, but this time certainly deadly hazardous zone.

Due to the positive cathode current $I_K$, at least some cathode emitters start to conduct (wanting to turn on the GTO). The anode current $I_A$ begins to rise extremely steeply because the current is obtained from the snubber (the diode is flooded, the inductance $L_S$ is rather small) and not via the di/dt choke $L_A$ (FIG. 1). The GTO is therefore turning on in a way not in any permissible specification (no di/dt limiting, undefined rate of increase of the gate current, flooded component in the tail current region). The fact that the anode voltage does not immediately drop to zero immediately after $t_3$ but only to approximately 300 V indicates that only individual cells are turning on (current inhomogeneity). However, the GTO cannot survive such loads and burns out.

Investigations have shown that currents of almost any magnitude in the GTO can be turned off at low anode voltages (for example 50 V). The higher the voltage applied, however, the more hazardous it becomes for the GTO according to the prior art to have to conduct cathode current. From about 400 V, this state must only be very weak and short, otherwise the GTO cannot handle it. This relationship between disconnectable current and anode voltage is based on the occurrence of dynamic avalanche at relatively high voltages and the possible current inhomogeneities.

The finding from the above analysis can be formulated in the form of drive conditions. In the text which follows, four conditions are named which must be satisfied, at least alternatively.

According to a first condition of the invention, the means for driving the gate must be designed in such a manner that the turn-off gain $I_A/I_G$,peak is distinctly less than 3 and, in particular, less than or equal to 2 and that a resultant anode voltage rise of at least 1 kV/$\mu$s is obtained.

As a consequence of this, gate current $I_G$ and anode current $I_A$ intersect before the anode voltage $V_A$ has risen by much. The cathode current $I_K$ therefore becomes zero much more rapidly than in the prior art. The first hazardous zone (FIG. 2: time between $t_1$ and $t_2$) largely loses its significance. In particular, this avoids the deadly second zone (FIG. 2: time $t_3$) completely: the gate current is now far above the tail current and an intersection is no longer possible.

To avoid regions of instability altogether, the gate drive must be designed in such a manner that an anode voltage rise of at least 1 kV/$\mu$s is obtained and that the cathode current $I_K$ is less than or equal to zero during the entire turn-off process, taking into consideration Kirchhoff's law $I_G+I_K=I_A$. The turn-off process is understood to be the time interval which begins when the threshold value has been reached by the gate current (compare turn-off gain) and ends with the decaying of the tail current. When this second condition has been satisfied, the first one formulated above is also satisfied.

A third condition, which has the avoidance of the second hazardous zone as a primary aim is that the gate drive is to be designed in such a manner that the gate current $I_G$ during turn-off is at least twice as high as the tail current $I_{tail}$ occurring. The magnitude of the tail current $I_{tail}$ is determined by, among other things, the internal structure of the GTO. In a medium voltage range (for example between 1000 and 3000 V) it is, roughly speaking, proportional to the voltage rise $dV_A/dt$. With a $dV_A/dt$ of, for example, 1 kV, $I_{tail}$ is approximately half as large as with a $dV_A/dt=2$ kV.

It should be noted at this point that hitherto rates of increase $dV_A/dt$ of less than 500 V/$\mu$s had been selected throughout.

Finally, a drive in which the gate current $I_G$ has a rate of increase of $dI_G/dt$ which is sufficient for building up a gate current of the magnitude of the maximum disconnectable anode current $I_{A,max}$ within 1 $\mu$s also leads to achieving an RF GTO.

In the power category aimed for (anode current $I_{A,max}>1$ kA), the gate current $I_G$ should therefore have a rate of increase $dI_G/dt$ of at least 1 kA/$\mu$s. As a result, the charge carriers in the GTO gate are extracted so rapidly that the injection from the cathode emitters is immediately stopped. The extraction acts on all GTO cells simultaneously and, as a result, no unwanted current focusing can occur.

During the translation of one or several of the said conditions into a realistic switching arrangement, some considerations are necessary which will be explained in the text which follows.

As has been said, a GTO must be driven much faster than hitherto. However, if a GTO is driven faster, its turn-off process is already accelerated right from the beginning. This is because the slow process of injection reduction (slow "throttling") from the cathode does not then occur and the cathodes can be turned off rapidly. In consequence, the anode voltage rise is no longer slow and rounded but hard and fast.

In this case, however, the snubber diode $D_S$ and the parasitic inductance $L_s$ responds with an even much greater overvoltage so that there is no overall gain for the GTO (because it must continue to conduct cathode current up to a considerable anode voltage). It is therefore necessary to reduce the gate circuit inductance down to insignificance (development of a new low-inductance package) or the snubber must also be modified.

The snubber must be modified in such a manner that, in spite of an increased dI/dt, the spike voltage is smaller than previously. This cannot be achieved by reducing the parasitic inductance $L_s$ alone because there is always the forward recovery of the diode $D_S$ in the circuit. Although special diodes are already being developed for conventional snubbers (so that greater values of $L_s$ can be permitted again and the design can thus be simplified), no decisive advance would be achieved even with the most suitable Si diodes. The proper approach is, instead, to connect at least some of the snubber capacitance directly in parallel with the GTO. The circuit inductance then drops to such an extent (5–10 nH) that the capacitor can already handle significant anode current before the anode voltage has passed the 100-V limit. Together with the increased gate current (faster also means lower turn-off gain), the cathode current can then decrease to zero in time, that is to say before much more than 100 V anode voltage are present. Below 100–200 V, however, a GTO can turn off almost any current without destruction as already mentioned.

A part of $C_s$ should therefore be connected in parallel with the GTO (for example 1 $\mu$F at 3 kA would push the anode current to about $\frac{1}{4}$-1/5 of the on value when 100–200 V has been reached. However, this results in a problem during turning-on: the parallel-connected capacitor discharges directly into the GTO and this whilst the plasma is still very small during normal firing. Without further precautions, this would destroy GTOs from all experience (exceeding the $dI_A/dt$ limit value). Now, if the GTO is also driven hard (fast) during firing, its destruction due to the discharging of the parallel capacitor can be avoided. This is because GTOs become faster and more homogeneous with harder turn-on. Since, furthermore, the $dI_A/dt$ is exceeded for only a very short time (only for discharging the parallel capacitor), the associated energy and power density is relatively low (at 3 kV and 1 µF, 4.5 J would be stored, which is 450 W at 100 Hz, that is to say less than half the typical turn-off losses).

From these considerations, the embodiments described in the text which follows are especially preferred.

FIG. 3 diagrammatically shows a protective gate circuit for turning off a GTO of familiar construction. It comprises
- a relatively low gate circuit inductance $L_G$ between gate unit GU and gate terminal of the GTO component,
- a high-voltage capacitance $C_{R1}$ between gate unit GU and cathode terminal of the GTO, and
- in parallel with the capacitance $C_{R1}$, a low-voltage capacitance $C_{E1}$ and a diode $D_1$, preceding $C_{E1}$, for isolating the capacitor voltages.

The gate circuit inductance is predetermined by the inductance which is unavoidable in conventional types of packaging. At this point, it should be recalled that the aim of the invention is the implementation of an RF GTO with conventional semiconductor components. It is intended to avoid the expenditure associated with a new design of packages.

The circuit shown in FIG. 3 is one for quasiresonant operating mode: the small capacitor $C_{R1}$ with high voltage (preferably $\geq 100$ V, for example $C_{R1} = 200$ V), which is connected to the output of the gate unit GU, initially supplies a current which rises rapidly in spite of the existing gate circuit inductance and which is maintained over a relatively long time (duration of the turn-off process) by a maintenance capacitor $C_{E1}$ after the discharging. (Instead of the single capacitor $C_{E1}$, two capacitances of different voltage, for example 50 V and 15 V, can also be provided if necessary). Taking into consideration the actual inductance in the GTO package, the capacitance $C_{R1}$ is dimensioned in such a manner that, after discharging, it has built up a gate current which corresponds to the maximum disconnectable anode current. The current from $C_{E1}$, which persists for a relatively long period, must be provided with a voltage which is below the avalanche value of the gate-cathode path (15–25 V).

Thus, a gate current is provided which is sufficiently high and fast for the cathode current to be less than zero under all circumstances. With the low voltage enduring for a relatively long time it can be avoided that the gate current collapses during switching and the component runs into the critical second zone (FIG. 2: time $t_3$).

A pulse shaping network, known per se, is also suitable for generating a rapidly rising gate current which is always above the tail current. The important factor is less the actual circuit design than that the desired function is fulfilled.

In conventional protective circuits, a large proportion of the gate circuit inductance is generated by the coaxial cable between the gate unit and the external gate terminal of the GTO component (FIG. 1: $L_G$). Of the typical 300 nH (that is to say $L_G$ overall), only about 30 nH are in the GTO package. According to a preferred embodiment of the invention, the gate unit is therefore connected to the gate of the GTO component by means of a ribbon conductor as is known from EP-0,381,849 Al (for example a polyimide ribbon metallized on both sides). In this manner, gate circuit inductances of $L_G \leq 50$ nH can be achieved without having to replace the existing packages by new ones. This leads to the desired rates of increase $dI_G/dt \geq 1$ kA/µs. At a maximum, about 5 kA/µs can be achieved by means of these simple measures.

An advantage of the hard drive is not lastly the short storage time: whereas the gate current in the prior art rises so slowly that up to 15 µs elapse between the triggering of the gate switch (MOSFET) and the start of the turn-off process in the GTO, the steep rise according to the invention ensures that this delay comes within the range of 1 µs. In addition, the fluctuations in the storage time which, it is known, depends on the respective magnitude of the anode current, are much less in the invention: due to the steep rise in gate current, the fluctuations can only have a range of some 100 ns. Overall, the switching process becomes more controllable in this manner.

The protective gate circuit according to the invention also saves energy. Although a much higher gate current must be generated, this is only for a very short time. The high turn-off gain previously also demanded time and again for energy reasons, thus loses its significance. Even in the small $L_G$, much less energy is stored than in the prior art.

Figure 4:
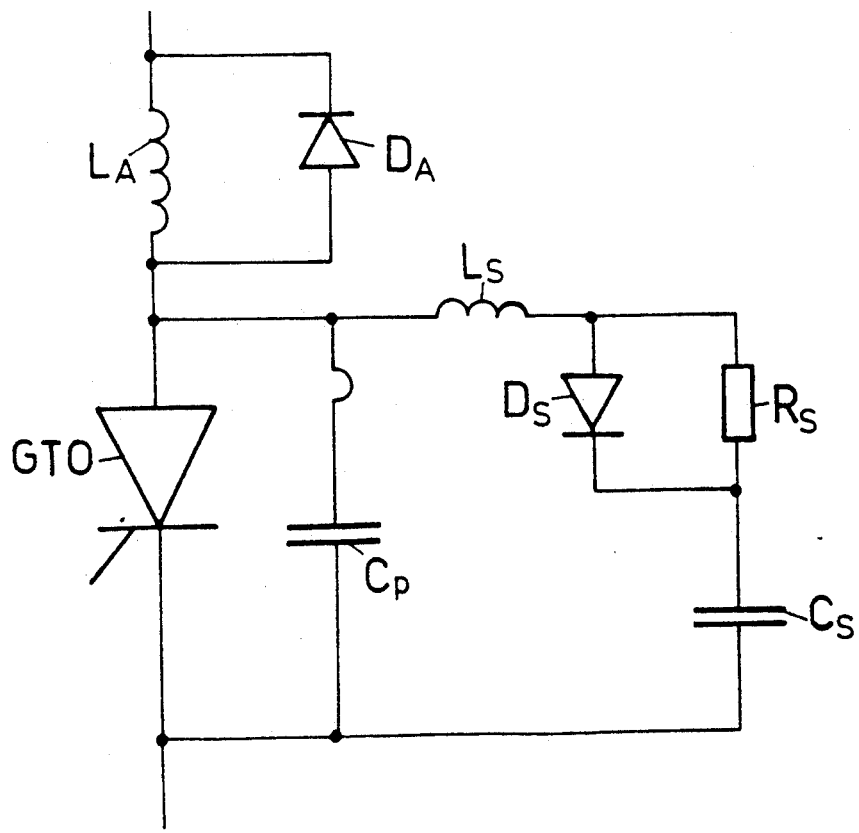
FIG. 4 shows a snubber in accordance with the invention.

FIG. 4 shows a snubber according to the invention. It comprises
- a capacitance $C_p$ connected directly in parallel with the GTO component (low-inductance circuit), and
- a conventional snubber with inductance $L_s$, diode $D_s$, capacitance $C_s$ and resistor $R_s$.

The parallel capacitance $C_p$ according to the invention provides the GTO with the possibility of reliable turn-off. It must be dimensioned in such a manner that the anode voltage rise $dV_A/dt$ is limited in such a manner that only a part of the load current (approximately ½–1/5) now flows through the GTO when the anode voltage passes the 100-V mark. However, it should be kept sufficiently small that during turn-on, a discharge into the GTO does not noticeably contribute to its losses so that it is not made more difficult to cool the GTO. Advantageous $C_p$ values for the abovementioned drive are dimensioned in accordance with the following rule:

$$3 \text{kV}/\mu s \leq I_A/C_p \leq 10 \text{kV}/\mu s \quad (I_A = \text{anode current}).$$

Thus, $C_p$ is smaller by a factor of 6–20 than the current $C_s$ (FIG. 1). Accordingly, it stores less energy. The additional loading due to the direct discharging of $C_p$ is of the order of magnitude of 10% of the total thermal load on the GTO.

Due to the fact that the snubber is divided into two, the remaining snubber circuit ($C_s$, $D_s$, $R_s$) and/or a clamping capacitor which may be necessary for limiting voltage peaks due to load and stray inductances can be dimensioned largely independently of the GTO component.

In parallel with $L_A$ (dI/dt choke), a diode $D_A$ is preferably placed or circuits such as the known Undeland circuit are used so that the energy stored in $L_A$ is not transferred to $C_s$. Otherwise, uneconomically high overvoltages could result. $C_s$ is therefore now only used for limiting dV/dt across the GTO itself. Since sufficient gate current is available due to the hard drive, $C_s$ can even be allowed to become completely zero, as a rule. In other words: the conventional part of the snubber circuit ($L_s$, $C_s$, $D_s$, $R_s$) can be left out altogether. This completely dispenses with the problems associated with the reverse recovery of the diode $D_s$ which have been diffused, in any case, by the $C_p$ according to the invention.

If the capacitance $C_p$ is not understood to be a part of the snubber but is associated with the GTO component, this "GTO/$C_p$ element" can be considered to be a switch which has advantageous characteristics and certain drive conditions and which is to be connected in accordance with recognised principles (for example with snubber, freewheeling and so forth). The parallel capacitance $C_p$ only brings insignificant advantages in the case of certain semiconductor components. Accordingly, the gate drive according to the invention will be accepted as satisfactory.

The invention also proposes improvements in the turning-on of the GTO which advantageously interact with the remaining protective circuit (see above).

Figure 5:
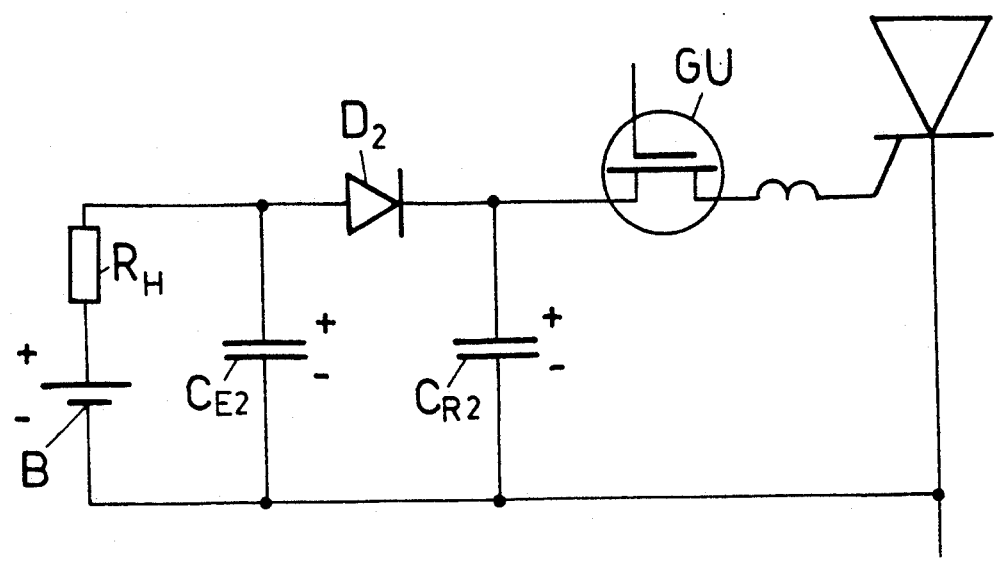
FIG. 5 shows a protective gate circuit for turning on the GTO.

FIG. 5 shows a preferred embodiment of the protective gate circuit for turning on the GTO. It achieves a hard turn-on: as during the turning-off (only with reverse polarity), a rapidly rising strong current impulse is applied to the gate. The circuit is advantageously similar to that needed for the turning-off. This provides an essentially symmetrical protective gate circuit.

When the switch (MOSFET) of the gate unit GU is closed, a rapidly rising current is injected from a high-voltage capacitor $C_{R2}$ (preferably $\geq 100$ V) into the gate of the GTO. After the relatively small capacitor $C_{R2}$ has discharged, a larger capacitor $C_{E2}$ maintains the firing current over the required time. $C_{E2}$ has a low voltage (typically 15 V) in comparison with $C_{R2}$. A diode $D_2$ isolates the high-voltage capacitor $C_{R2}$ from the low-voltage capacitor $C_{E2}$. The holding current comes from, for example, the battery B indicated in the figure via the resistor $R_H$.

The harder turn-on also has a positive effect on the homogeneity of the current. The discharging of $C_p$ into the GTO thus also becomes less critical.

Due to the hard turn-on in comparison with the prior art, it should also be possible to load the GTO with higher $dI_A/dt$ values.

Thus, a reduction of $L_A$ could be expected (that is to say less energy is stored in $L_A$). Because of the firing and plasma propagation mechanisms involved, however, the load carrying capability would depend on different factors, that is to say it would have to be type-tested from element to element.

Figure 6:
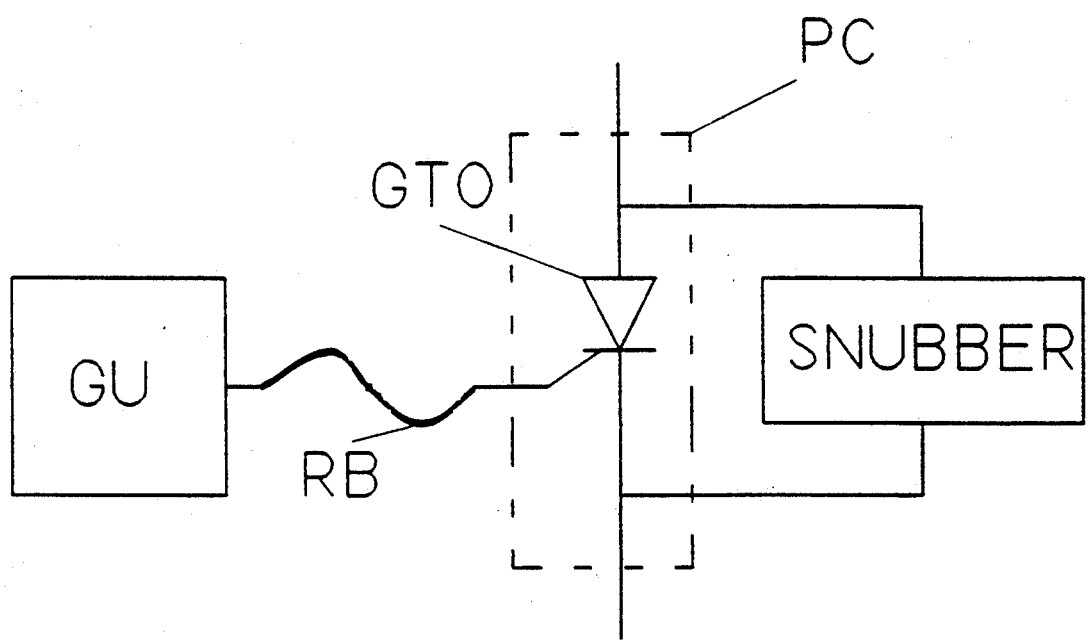
FIG. 6 is a schematic block diagram showing a protective gate circuit for turning off the GTO and a snubber connected in parallel with the GTO.

FIG. 6 is a schematic circuit diagram illustrating connection of a gate unit GU to the gate of the GTO by means of a ribbon conductor RB. The GTO is schematically shown housed in a package PC, and the gate unit GU is arranged outside the package PC housing the GTO. Connected in parallel across the anode and the cathode of the GTO is a snubber circuit.

Naturally, the protective circuit proposed here also allows more recent finely structured semiconductor components to be utilized. The fact that it has hitherto not been possible to achieve any distinct advantages with finely structured GTOs (FS-GTO) and SIThs is also significantly due to the violation of the rules described here. For this reason, a distinct increase in the turn-off current densities compared with conventional elements can therefore be expected with FS-GTOs. In addition, it will be possible to avoid the turn-on inhomogeneities using SIThs and, in particular, FCThs. As a consequence, it will be possible to dispense with the hard drive during turn-on and the limiting of $dI_A/dt$.

In summary, it can be stated that the invention has shown the way towards achieving an RF-GTO. The circuit complexity is much reduced and, at the same time, operational reliability is increased. The RF-GTO can be constructed, in particular, using semiconductor components already commercially available.

Obviously, numerous modifications and variations of the present invention are possible in light of the above teachings. It is therefore to be understood that within the scope of the appended claims, the invention may be practiced otherwise than as specifically described herein.

LIST OF DESIGNATIONS

B—battery; $C_s$, $C_G$, $C_p$, $C_{R1}$, $C_{R2}$, $C_{E1}$, $C_{E2}$—capacitance; $D_s$, $D_1$, $D_2$—diode; GU—gate unit; $I_A$—anode current; $I_G$—gate current; $I_K$—cathode current; $L_A$—$dI/dt$ choke; $L_s$, $L_G$—inductance; $R_s$, $R_H$—resistor; $V_A$—anode voltage.

What is claimed as new and desired to be secured by Letters Patent of the United States is:

1. Switching arrangement for a high-power RF-GTO comprising:
    a latching semiconductor component having an anode, a cathode and a gate;
    means for generating a gate current $I_G$ at the gate for turning off an anode current flowing $I_A$ in the semiconductor component, the gate current having a maximum value $I_{G,peak}$ and a rate of increase $dI_G/dt$, said anode current $I_A$ having a maximum value $I_{A,max}$ and a slowly decaying part $I_{A,tail}$ at turn off;
    said means comprising a gate unit with two terminals, an inductor connected between the gate of the semiconductor component and the first terminal, and means, connected between the cathode of the semiconductor component and the second terminal of the gate unit, for generating a rapid rise of the gate current $I_G$ which is maintained at least until the tail current $I_{A,tail}$ decays;
wherein:
    the gate unit is connected to the gate by means of a conductor having a lowest-possible inductance forming said inductor,
    the ratio of the anode current A and the maximum value of the gate current $I_{G,peak}$, $I_A/I_{G,peak}$, is less than 3, and
    a resultant anode voltage rise of at least 1 kv/$\mu$s is produced.

2. The arrangement according to claim 1, wherein the ratio $I_A/I_{G,peak}$ is less than or equal to 2.

3. Switching arrangement for a high-power RF-GTO, comprising:
    a latching semiconductor component having an anode, a cathode and a gate;
    means for generating a gate current IG at the gate for turning off an anode current $I_A$ flowing in the semiconductor component, the gate current having a maximum value $I_{G,peak}$ and a rate of increase $dI_G/dt$, said anode current $I_A$ having a maximum value $I_{A,max}$ and a slowly decaying part $I_{A,tail}$, at turn off;
    said means comprising a gate unit with two terminals, an inductor connected between the gate of the semiconductor component and the first terminal, and means, connected between the cathode of the semiconductor component and the second terminal of the gate unit, for generating a rapid rise of the gate current $I_G$ which is maintained at least until the tail current $I_{A,tail}$ decays;

wherein:

the gate unit is connected to the gate by means of a conductor having a lowest-possible inductance forming said inductor, a resultant anode voltage rise of at least 1 kV/μs is produced, and a cathode current $I_K$ is less than or equal to zero during turn-off, taking into consideration Kirchhoff's law $I_G + I_K = I_A$.

4. Switching arrangement for a high-power RF-GTO, comprising:

a latching-type semiconductor component having an anode, a cathode and a gate;

means for generating a gate current $I_G$ at the gate for turning off an anode current $I_A$ flowing in the semiconductor component, the gate current having a maximum value $I_{G,peak}$ and a rate of increase $dI_G/dt$, said anode current $I_A$ having a maximum value $I_{A,max}$ and a slowly decaying part $I_{A,tail}$ at turn off;

said means comprising a gate unit with two terminals, an inductor connected between the gate of the semiconductor component and the first terminal, and means, connected between the cathode of the semiconductor component and the second terminal of the gate unit, for generating a rapid rise of the gate current $I_G$ which is maintained at least until the tail current $I_{A,tail}$ decays;

wherein:

the gate unit is connected to the gate by means of a conductor having a lowest-possible inductance forming said inductor, and during turn-off, the gate current $I_G$ is at least twice as high as the tail current $I_{A,tail}$.

5. Switching arrangement for a high-power RF-GTO, comprising:

a latching-type semiconductor component having an anode, a cathode and a gate;

means for generating a gate current IG at the gate for turning off an anode current $I_A$ flowing in the semiconductor component, the gate current having a maximum value $I_{G,peak}$ and a rate of increase $dI_G/dt$, said anode current $I_A$ having a maximum value $I_{A,max}$ and a slowly decaying part $I_{A,tail}$ during turn off;

said means comprising a gate unit with two terminals, an inductor connected between the gate of the semiconductor component and the first terminal, and means, connected between the cathode of the semiconductor component and the second terminal of the gate unit, for generating a rapid rise of the gate current $I_G$ which is maintained at least until the tail current $I_{A,tail}$ decays;

wherein:

the gate unit is connected to the gate by means of a conductor having a lowest-possible inductance forming said inductor, and the rate of increase $dI_G/dt$ is sufficient for building up a gate current of magnitude of a maximum disconnectable anode current $I_{A,max}$ within 1 μs.

6. Switching arrangement as claimed in claims 2, 3, 4 or 5, wherein the conductor comprises a ribbon conductor, and the inductance of the conductor is preferably less than 50 nH.

7. Switching arrangement as claimed in claim 6, wherein the means for generating a rapid rise of the gate current comprise a capacitance $C_{R1}$ which is discharged for the turn-off process in order to immediately build up a gate current which corresponds to a maximum disconnectable anode current.

8. Switching arrangement as claimed in claim 7, wherein the capacitance $C_{R1}$ has a voltage of at least 100 V before the semiconductor component is turned off and, in addition, at least one further capacitance $C_{E1}$ is provided which, after the discharge of the capacitance $C_{R1}$, pulls a holding current from the gate which endures for a relatively long time and which is always greater than the occurring tail current $I_{A,tail}$.

9. Switching arrangement as claimed clams 2, 3, 4 or 5, comprising a low-inductance capacitance $C_p$ provided directly in parallel with the semiconductor component between the anode and cathode, which capacitance $C_p$ limits the anode voltage rise $dV_A/dt$, at least after an anode voltage $V_A = 400$ V has been reached, in such a manner that the subsequent anode current $I_A$ becomes less than the gate current $I_G$.

10. Switching arrangement as claimed in claim 9, wherein the capacitance $C_p$ is dimensioned with respect to the anode current $I_A$ in accordance with the following rule:

$$3 kV/\mu s \leq I_A/C_p \leq 10 kV/\mu s.$$

11. Switching arrangement as claimed in claim 10, comprising one of a freewheeling circuit and a snubber for keeping energy stored in the inductance $L_A$ away from the parallel capacitance $C_p$.

12. Switching arrangement as claimed in claim 9, comprising means for generating a turn-on gate current having a rate of increase $dI_G/dt$ of at least 20 A/s to produce a hard and fast turn-on of the semiconductor component.

13. Switching arrangement as claimed in claim 12, wherein said means for generating a turn-on gate current comprise a protective circuit for the gate.

14. Switching arrangement as claimed claims 2, 3, 4 or 5, comprising means for limiting the rate of anode voltage rise dV/dt during turn-off of the semiconductor component.

15. Switching arrangement as claimed claims 2, 3, 4 or 5, wherein the semiconductor component is packed in a package, and the means for generating the gate current are arranged outside the package of the semiconductor component.

16. Switching arrangement as claimed claims 2, 3, 4 or 5, wherein the latching semiconductor component comprises a component selected from the group consisting of a 2-layer FCThs, a 2-layer SIThs, a 4-layer GTO and an FS-GTO, and belongs to a power category of greater than 1.5 kV and greater than 1 kA.

* * * * *